July 14, 1970 D. P. GUSH ET AL 3,520,606

APPARATUS FOR PREPARING A PRINTING PLATE FROM A PHOTOSENSITIVE COMPOSITION

Filed Oct. 12, 1967 4 Sheets-Sheet 1

INVENTORS
Donald P. Gush
Manuel C. Uy
Einstein E. Caicedo
BY Richard Q. Plunkett
ATTORNEY INVENTORS
Donald P. Gush
Manuel C. Uy
Einstein E. Caicedo
BY Richard P. Plunkett
ATTORNEY INVENTORS
ald P. Gush
Manuel C. Uy
Einstein E. Caicedo
BY Richard P. Plunkett
ATTORNEY July 14, 1970 D. P. GUSH ET AL 3,520,606
APPARATUS FOR PREPARING A PRINTING PLATE FROM A PHOTOSENSITIVE COMPOSITION
Filed Oct. 12, 1967 4 Sheets-Sheet 4

INVENTORS
Donald P. Gush
Manuel C. Uy
Einstein E. Caicedo

BY Richard P. Plunkett
ATTORNEY

United States Patent Office 3,520,606
Patented July 14, 1970

3,520,606
APPARATUS FOR PREPARING A PRINTING PLATE FROM A PHOTOSENSITIVE COMPOSITION

Donald P. Gush, Hyattsville, Manuel C. Uy, Glen Burnie, and Einstein E. Caicedo, Silver Spring, Md., assignors to W. R. Grace & Co., New York, N.Y., a corporation of Connecticut Filed Oct. 12, 1967, Ser. No. 674,772
Int. Cl. G03b *27/30*
U.S. Cl. 355—85 9 Claims

ABSTRACT OF THE DISCLOSURE

An apparatus for forming a developable printing plate from a liquid photosensitive composition comprising an enclosed housing having at one end an actinic light source and at the other end a vacuum table adapted to receive thereon a liquid photosensitive composition in a mold on a support, which composition on exposure to the actinic light through an image bearing transparency becomes selectively insolubilized in the exposed portions thereof.

One of the primary objects of this invention is to provide an apparatus useful in the formation of plastic printing plates from liquid photosensitive compositions. Another object of this invention is to provide an apparatus for forming letterpress printing plates from liquid photosensitive compositions. Still another object of the instant invention is to provide an apparatus which will provide solid printing plates from liquid photosensitive compositions. Further objects and features of this invention will best be understood from a detailed description of a preferred embodiment thereof selected for the purpose of illustration as shown in the accompanying drawings in which:

Figure 1:
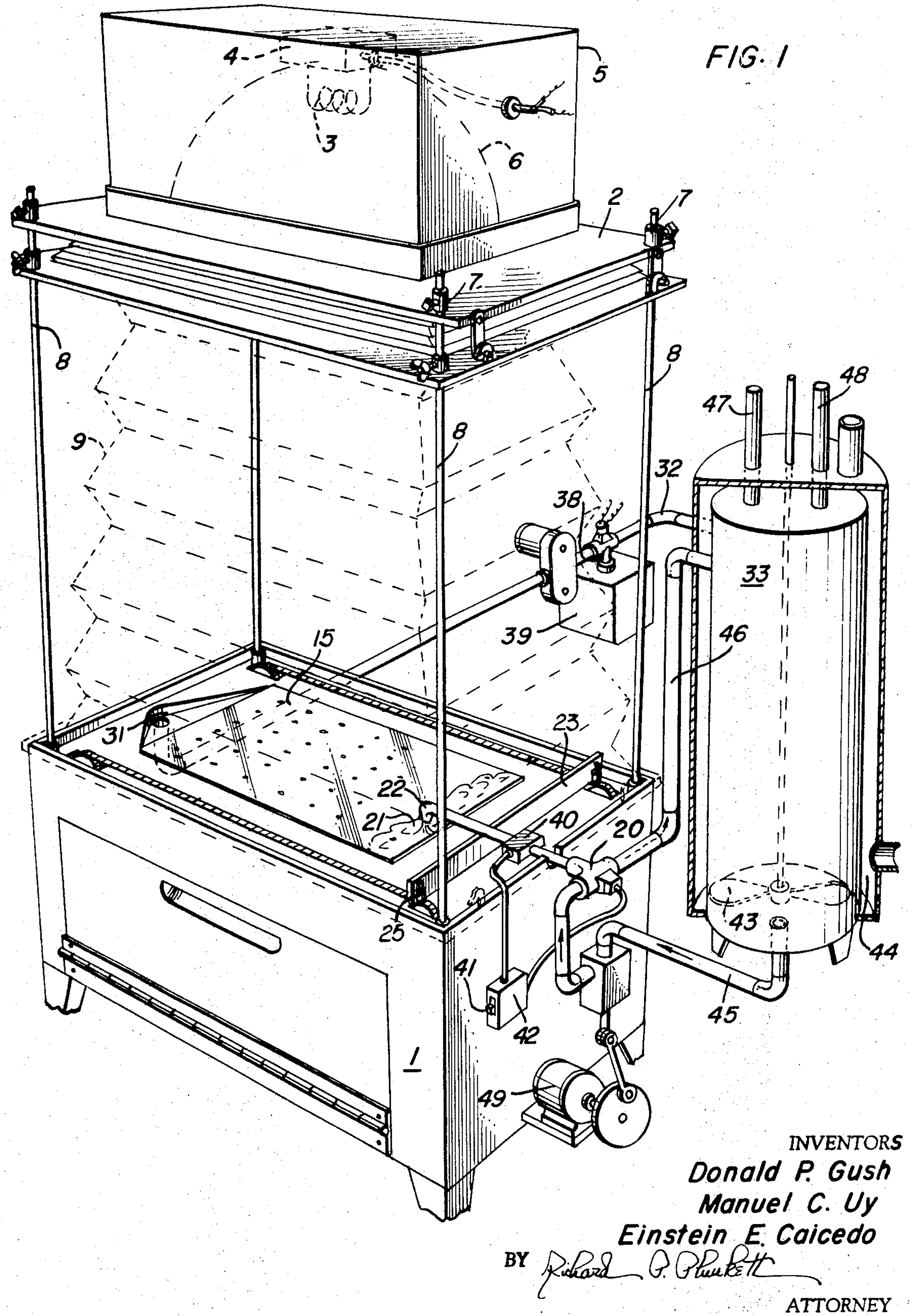
FIG. 1 is a view in perspective of the apparatus of the invention.
Figure 2:
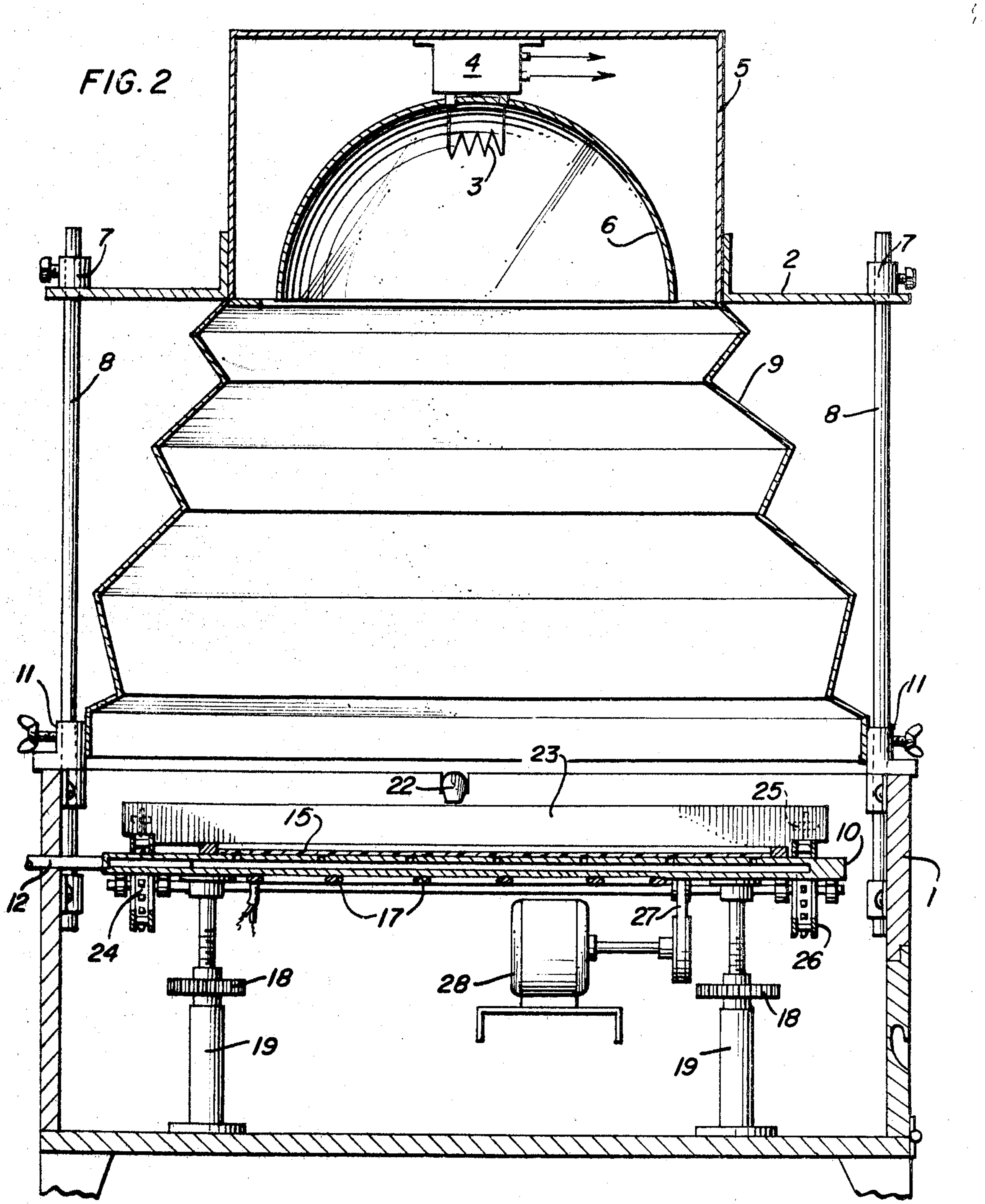
FIG. 2 is a cross sectional view in side elevation of the housing for the printing element.
Figure 3:
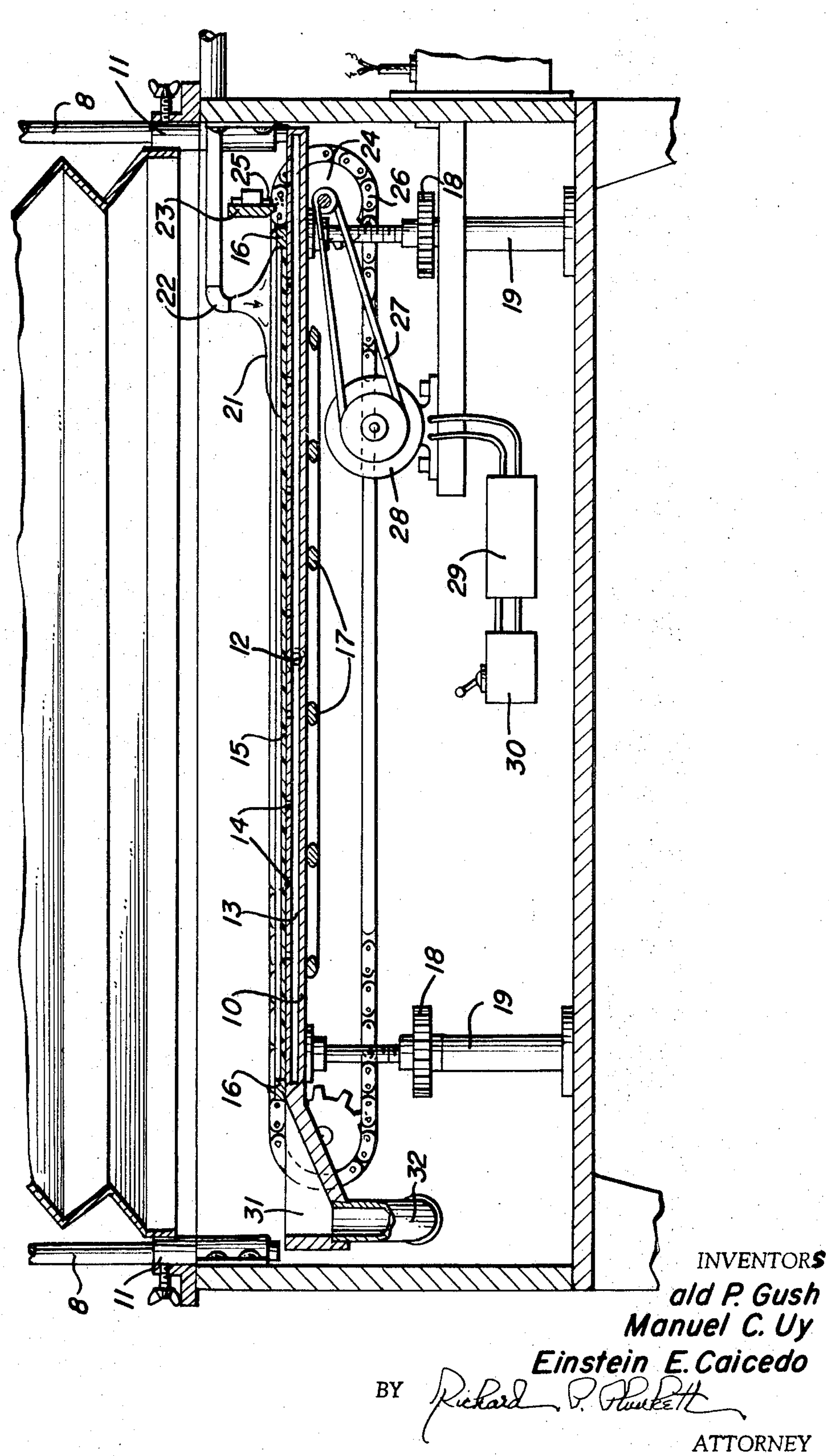
FIG. 3 is a cross sectional view in front elevation of the vacuum table portion of the printing element.
Figure 4:
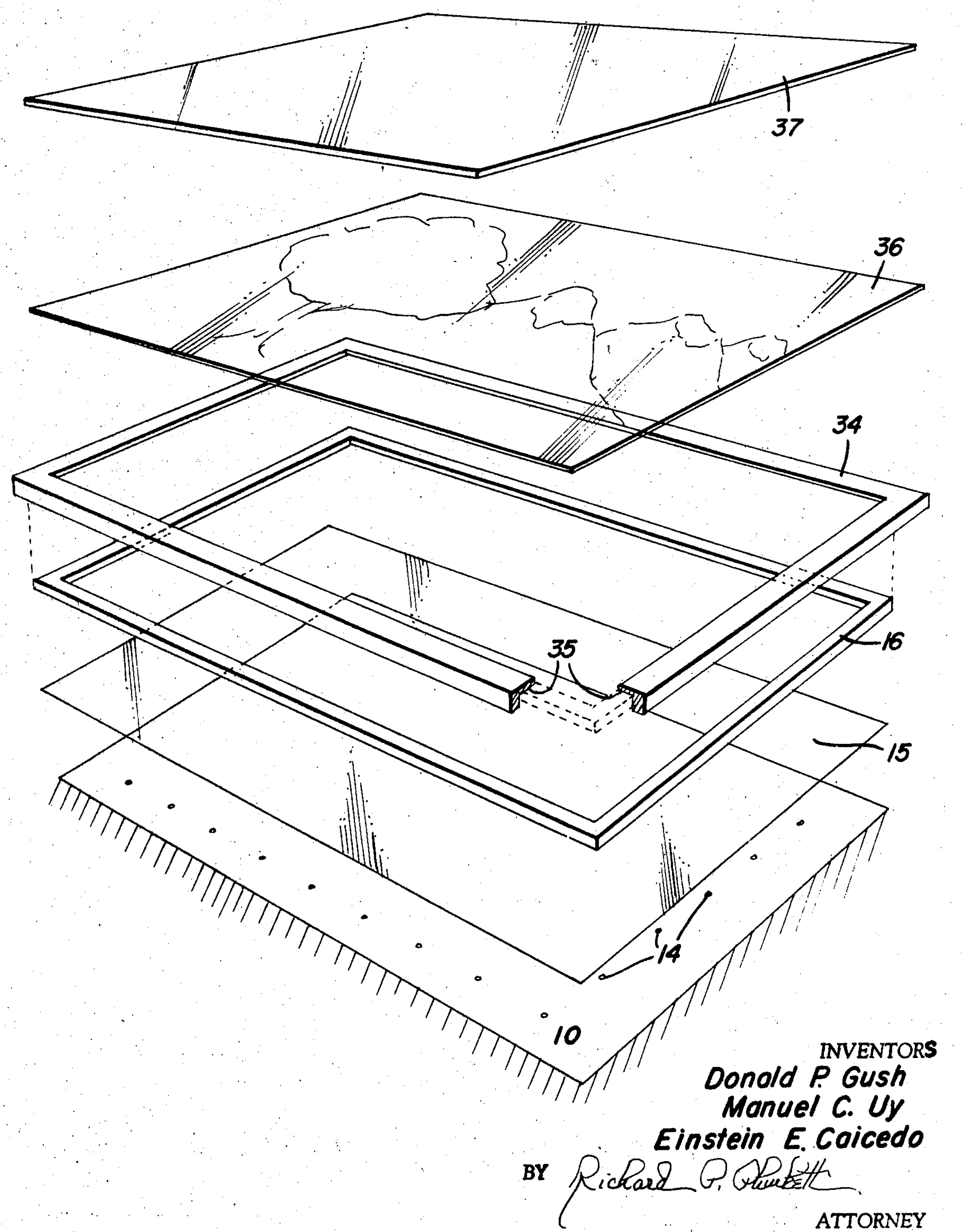
FIG. 4 is a diagrammatic view of the various layers exposed to the actinic light source.

A preferred embodiment of my invention herein shown in FIG. 1 includes in its general organization a housing indicated generally at 1 in which various elements are mounted. At the top of the housing, as shown in FIG. 2, there is a first end wall 2 on which is mounted an actinic light source 3 connected to a power supply 4, said light source is located in a box 5 with a hemispherical reflective portion 6 around the light source 3 to direct the rays onto the work. The first end wall can be raised or lowered by the positioning of clamps 7 on the spacing rods 8 to set the light source 3 at the desired distance from the work. Additionally the first end wall 2 has connected thereto a side wall 9 substantially perpendicular to said first end wall. Said side wall can be adjusted to extend to a second end wall 10 thereby forming an enclosure by the positioning of clamps 11 on the spacing rods 8. As shown in FIG. 3, the second end wall 10 can be a vacuum table with a vacuum source 12 to pull a vacuum through a hollowed out portion 13 of the table and through small orifices 14 on the upper side of the table to secure a support layer 15 and mold or frame 16 to said table. The same channeling through the vacuum table by which a vacuum is applied can also intermittently be used to apply air or other gaseous pressure to the support layer 15 and mold 16 to facilitate the removal thereof from table 10. Vacuum table 10 can be heated by heating elements 17 and leveled by the adjustment of leveling knobs 18 on the leveling jacks 19 when necessary. In FIG. 4 is shown the upper surface of the vacuum table 10 with the small vacuum orifices 14 throughout the surface. The application of a vacuum through the orifices 14 hold a support layer 15 for the printing plate in a flat level position. The picture frame type mold 16 is set on the support layer 15 and a liquid photosensitive composition 21 as shown in FIG. 3 is fed from a feed outlet 22 into mold 16 and onto at least a portion of support layer 15. A removable doctor blade 23 stationed at one edge of the mold is connected to a power drive 24 by means of adjustable pins 25 that engage parallel sprocket chains 26 driven by a belt 27 connected to a variable speed motor 28 wired to a variable motor speed control 29 operated by a programable switch 30. The doctor blade 23 traverses the mold 16 to spread the liquid photosensitive composition evenly throughout the mold 16 and to remove overflow excess liquid photosensitive composition 21 therefrom. At the end of the drawdown, the programable switch 30 stops the motor 28 and the doctor blade 23 is returned by hand to its starting position before making the next drawdown. The excess liquid photosensitive composition is collected in drain 31 and recycled, if desired, through excess recycle line 32 to reservoir 33 for reuse or collected in storage container 39 through collection line 38. Optionally, as shown in FIG. 4, a spacer 34 can be positioned by interlocking edges 35 on the mold 16 containing the liquid photosensitive composition 21, and an image bearing transparency 36, preferably adhered to a photographic glass plate 37 is positioned on top of said spacer 34 in substantially spaced parallel relationship to the surfaces of the liquid photosensitive composition 21. Alternatively, spacer 34 can be omitted and image bearing transparency 36 can be placed in contact with and in substantially parallel relationship to the surface of the liquid photosensitive composition 21. Returning to FIG. 1 the liquid photosensitive composition 21 from feed outlet 22 is supplied in a metered quantity by means of a variable volumetric flow metering device 40 at such time as a switch 41 in the volumetric flow control 42 is actuated to de-energize a two way solenoid valve 20 recycling the liquid photosensitive composition 21 to reservoir 33 by means of a positive displacement pump 49. Reservoir 33 is a tank equipped with agitator 43, steam jacket 44, liquid photosensitive composition outlet line 45, recycle inlet line 46, excess recycle inlet line 32, tank feed inlet 47 and vacuum degassing line 48 used to maintain the liquid photosensitive composition in a heated, degassed condition so as to be readily applicable to the vacuum table 10 when needed. The degassing by vacuum through degassing line 48 can be carried on intermittently or constantly as desired. Additionally, if necessary, the lines carrying the liquid photosensitive composition can be insulated or jacketed to maintain the composition in a heated, non-viscous state i.e. at a temperature ranging from room temperature up to 100° C.

Thus, to operate the apparatus one places a support layer 15 on vacuum table 10 and thereon places mold 16. A vacuum is applied to vacuum table 10 through the orifices 14 to maintain the support layer in a secured position. Next one actuates the solenoid valve 20 by manipulating switch 41 to transfer the flow of the liquid photosensitive composition 21 from recycle line 46 to feed outlet 22 in order to supply the mold with sufficient liquid photosensitive composition in a predetermined metered amount dependent upon the size of the mold. Doctor blade 23 is set in place on the parallel sprocket chain 26 and activated by the programable switch 30 to traverse the mold thereby spreading the photosensitive composition 21 evenly therethrough and scraping off the overflow liquid composition into drain 31. Doctor blade 23 is then removed and, if desired, a spacer 34 is positioned onto the filled mold containing the liquid photosensitive composition 21 and an image bearing transparency 36, preferably adhering to a photographic glass plate 37 is positioned with the transparency down in substantially spaced parallel relationship to the surface of the liquid photosensitive composition 21. If the spacer is omitted the image bearing transparency can be placed in direct contact with the surface of the liquid photosensitive composition or to facilitate removal therefrom a thin layer of a protective film of silicone or other well known release agent can be applied to the transparency prior to contact with the liquid photosensitive composition.

After the transparency is in position, the side wall 9 is lowered to form an enclosure between end wall 2 and end wall 10. The actinic light source is activated so as to radiate actinic light through the hinge bearing transparency onto the exposed portion of the liquid photosensitive composition thereby solidifying the exposed portion. The UV wavelength operable to produce printing plates in the apparatus of the invention is in the range 2500–4000 angstroms. Various light sources can be used to obtain sufficient UV light to operate the instant apparatus. Such sources includes but are not limited to, carbon arcs, mercury arcs, fluorescent lamps with special ultraviolet light emitting phosphers, xenon arcs, argon glow lamps and photographic flood lamps. Of these, the mercury vapor arcs, particularly the sun lamp type and the xenon arcs are very useful. The sun lamp mercury vapor arcs are customarily used at a distance of 7 to 10″ from the liquid photosensitive composition, whereas the xenon arc is placed at a distance of 24 to 40″ from the liquid photosensitive layer. With a more uniform extended source of low intrinsic brilliance, such as a group of contiguous fluorescent lamps with special phosphers, the liquid photosensitive composition can be exposed within an inch of the lamp.

It is important to select the correct exposure time in employing the apparatus of the instant invention. That is, in making printing plates, it is essential that the exposure be sufficient to harden the photosensitive composition in the exposed image areas without causing hardening in the non-image areas. Aside from the exposure time and the light intensity, the extent of the exposure is dependent on the thickness of the liquid photosensitive layer, the temperature, the presence of light absorbing pigments or dyes in the liquid photosensitive composition and the character of the image to be reproduced. In general, the thicker the layer of the liquid photosensitive composition the longer the exposure time. It has been observed that hardening starts at the surface of the liquid photosensitive layer closest to the light source and proceeds downward to the support. With insufficient exposure, the layer may have a hard surface but, through lack of a clear-through hardening the relief will be removed when the unexposed area is removed in development i.e. washing. Inasmuch as the hardening rate usually increases at higher temperatures, less exposure is required thereat than at room temperature. Thus, ultraviolet light sources that emit heat are more efficient than cold ultraviolt light sources. However, care must be exercised that too high a temperature is not obtained during exposure to an actinic light, as this leads to, in some cases, thermal expansion of the liquid photosensitive composition which results in image distortion. It is preferred that the actinic light radiation be carried out at a temperature in the range of 20–70° C. Due to the number of variables which affect exposure time, optimum results are best obtained by trial and error with characterization after each exposure.

Printing plates from liquid photosensitive compositions can also be prepared by the instant apparatus by projecting the actinic light through a suitable lens system.

After the required exposure to actinic light is obtained, the light source is turned off and side wall 9 is raised. The vacuum to vacuum table 10 is shut off and the support 15 with the photosensitized composition 21, mold 16, spacer 34, image bearing transparency 36 and photographic plate 37 is removed from the apparatus. Thereafter, spacer 34, image bearing transparency 36 and the photographic glass plate is removed from the photosensitized composition. The photosensitized composition 21 and its support 15 are then removed from the mold and washed and/or blotted with a porous absorbent material to remove the unexposed liquid photosensitive composition.

The solvent employed for washing (i.e. developing the relief image) of the printing plate made from the liquid photosensitive composition is primarily a diluent which reduces the viscosity of the unexposed liquid photosensitive composition so that it is easily removed. Removal can be speeded up by blotting the unexposed area with a sponge and the like. The washing liquid is selected so that it is readily miscible with or emulsified with the unexposed liquid photosensitive composition yet has little action on the exposed hardened image or the support layer. The solvent employed for washing will depend on the liquid photosensitive composition and includes, but is not limited to, water, water and a detergent and/or soap, mixtures of alcohols e.g. methanol and/or ethanol with or without ethyl, methyl, or propyl acetate. Other solvents with high evaporation rates are well known to those skilled in the art. It should be noted herein that the term "solvent" includes not only organic solvents but also water and other aqueous systems wherein the unexposed liquid photosensitive composition is soluble (including dispersible) in said systems and the exposed liquid photosensitized portion is not so affected. In those instances where the photosensitized composition is acidic or basic, the printing relief can be developed by dissolving or dispersing the unexposed areas in an aqueous system of the opposite polarity i.e. to use an aqueous acidic solvent system with a basic liquid photosensitized composition and vice versa. The solvent can be applied by a sponge, brush, blotter or by means of jets or sprays. If desired, a porous, absorbent material can be used without a solvent in which case the unreacted liquid is removed mechanically.

In the instant apparatus, line or half tone relief plates can be made very rapidly. Naturally the time will vary with the particular liquid photosensitive composition and the intensity of the light but exposure period from 1 second to 20 minutes are usually employed.

Various liquid photosensitive compositions are operable and employed to make printing plates in the apparatus of the instant invention. Such liquid photosenitive composition include, but are not limited to, those set out in U.S. Pat. No. 2,760,863, assigned to E. I. du Pont de Nemours & Co. and U.S. Ser. No. 617,801 assigned to the same assignee as the instant application.

In U.S. Ser. No. 617,801 the liquid photosensitive composition comprises a polyene and a polythiol which when exposed to UV radiation (e.g. sunlight) preferably in the presence of a photoinitiator forms a solid polythioether. Specifically the polyene is formed as follows. 751 g. (0.38 moles) of a commercially available polyoxypropylene glycol sold under the tradename "Pluracol P2010" by Wyandotte Chemical Co. was degassed at room temperature for 3 hours and then charged to a dry resin kettle maintained under a nitrogen atmosphere and equipped with a condenser, stirrer, thermometer and gas inlet and outlet. 132 g. (0.76 moles) of tolylene-2,4-diisoyanate was charged to the kettle and the kettle was heated for 2 hours at 120° C. with stirring under nitrogen. After cooling 58 g. (1.0 moles) of allyl alcohol was added and the mixture was refluxed at 120° C. overnight. Excess allyl alcohol was stripped by vacuum overnight at 120° C. The thus formed allyl terminated liquid prepolymer had a viscosity of 1500 cps. as measured on a Brookfield Viscometer at 70° C. and a molecular weight of approximately 2500.

One mole of the thus formed polyene is then admixed with a stoichiometric amount of a polythiol i.e. 0.5 mole of pentaerythritol tetrakis ($\beta$-mercaptopropionate) and 0.5 g. of acetophenone (U.V. initiator) and exposed to U.V. radiation (sunlight). In 15 minutes a solid polythioether was formed in the desired shape. Various other liquid photosensitive compositions can be employed in the instant apparatus for making printing plates and are well known to those skilled in the art.

The employment of a spacer between the liquid photosensitive composition and the image bearing transparency facilitates removal of the hardened photosensitized composition from the image bearing transparency after it has been exposed to actinic light. The spacers are merely employed to maintain an air gap between the liquid photosensitive composition and the image bearing transparency and said air gap can range from 0.1 to 250 mils or more.

In general the thickness of the liquid photosensitive composition employed as a printing plate can vary from 0.1 to 500 mils or more. For lithographic printing plates the thickness may range between about 0.1 to 5 mils; for letterset (dry offset) plates, the thickness may be customarily in the 5 to 25 mil range; for letterpress printing thicknesses of 15 to 500 mils are common. For letterpress newspaper or magazine printing plates, the thickness of the liquid photosensitive layer will be about 10 to about 35 mils. Thicker layers are sometimes employed for the flexographic printing of designs and relatively large areas with letterpress printing plates.

The actinic light is applied to the liquid photosensitive composition for periods ranging from 1 second to 20 minutes. When the actinic light source is applied, side wall 9 is preferably extended so as to form an enclosure between end walls 10 and 2 thus decreasing the amount of light scattering in the liquid photosensitive composition.

Since numerous minor variations of the preferred embodiment of the invention herein shown will now be obvious to those skilled in the art, it is herein declared that the intention is not to confine the invention to these preferred embodiments but rather to limit it in terms of the appended claims.

What is claimed is:

1. Apparatus for forming a developable printing plate from a liquid photosensitive composition comprising (a) housing means forming an enclosure comprising (1) first and second end walls in substantially spaced parallel relationship to each other, said first end wall housing an actinic light source and having means to adjust the spaced relationship between said first and second wall and a side wall substantially perpendicular to said end walls, said side wall and said end walls defining an enclosure, (2) vacuum means operating through said second wall whereby a support layer and a frame may be securely affixed to said second wall (3) means for supplying a liquid photosensitive composition to said frame, (4) means for spreading the liquid photosensitive composition uniformly throughout the frame, and for removing excess liquid photosensitive composition from said frame, (5) drain means for removing excess liquid photosensitive composition from said housing, (6) an image bearing transparency plate adapted to be affixed in a substantially parallel spaced relationship with said liquid photosensitive composition (7) means to adjust the spaced relationship between the surface of the liquid photosensitive composition and the image bearing transparency and (8) means for supplying actinic radiation through said image bearing transparency to the liquid photosensitive composition to selectively insolubilize the exposed portions of the liquid photosensitive composition.

2. The apparatus according to claim 1 wherein the second wall is a heated vacuum table adapted with means to level the table.

3. The apparatus according to claim 1 wherein the side wall is extendable.

4. The apparatus according to claim 3 wherein the extendable wall is a bellows.

5. The apparatus according to claim 1 wherein the means for supplying the liquid photosensitive composition is an automatic pump and reservoir system comprising a reservoir means for storing a supply of said liquid photosensitive composition, pump means for pumping the liquid photosensitive composition from said reservoir to said frame connecting means connecting said pump means to the reservoir means and an automatic control valve means located in said connecting means between said pump means and said frame for regulating flow to provide a metered quantity of liquid photosensitive composition at desired time intervals.

6. The apparatus according to claim 5 wherein the reservoir means is a heated reservoir equipped with agitator, degassing vacuum outlet and recycle line.

7. The apparatus according to claim 1 wherein the means for removing excess liquid photosensitive composition from the mold is a doctor blade.

8. The apparatus according to claim 1 wherein the drain means for removing excess liquid photosensitive composition from the housing is an automatic pump and reservoir system comprising a drain, heated connecting means between said drain and a reservoir means for storing a supply of said liquid photosensitive composition, pumping means in said connecting means between said drain and said reservoir means.

9. The apparatus according to claim 1 wherein the means for supplying actinic radiation is a pulsed xenon arc lamp.

References Cited

UNITED STATES PATENTS

| | | | |
|---|---|---|---|
| 1,838,312 | 12/1931 | Kanolt | 355—133 |
| 2,989,911 | 6/1961 | Winnek | 95—89 |
| 3,059,560 | 10/1962 | Gutzmer | 95—89 |
| 3,087,404 | 4/1963 | Hase | 355—132 |
| 3,368,471 | 2/1968 | Beato | 355—91 |

JOHN M. HORAN, Primary Examiner

U.S. Cl. X.R.

95—89